US007259625B2

(12) United States Patent
Sanderson

(10) Patent No.: US 7,259,625 B2
(45) Date of Patent: Aug. 21, 2007

(54) HIGH Q MONOLITHIC INDUCTORS FOR USE IN DIFFERENTIAL CIRCUITS

(75) Inventor: David I. Sanderson, Walden, NY (US)

(73) Assignee: International Business Machines Corporation, Armonk, NY (US)

( * ) Notice: Subject to any disclaimer, the term of this patent is extended or adjusted under 35 U.S.C. 154(b) by 325 days.

(21) Appl. No.: 10/907,537

(22) Filed: Apr. 5, 2005

(65) Prior Publication Data

US 2006/0220737 A1 Oct. 5, 2006

(51) Int. Cl.
*H03F 3/45* (2006.01)
(52) U.S. Cl. .................... 330/253; 330/68; 330/302; 336/84 R; 257/528
(58) Field of Classification Search ........... 330/253, 330/68, 302; 336/84 R; 324/225; 257/528, 257/531
See application file for complete search history.

(56) References Cited

U.S. PATENT DOCUMENTS

| | | | |
|---|---|---|---|
| 5,616,952 A | | 4/1997 | Nakano et al. |
| 5,625,548 A | * | 4/1997 | Gold et al. .................... 363/98 |
| 6,348,791 B2 | * | 2/2002 | Shattil ......................... 324/225 |
| 6,411,108 B1 | * | 6/2002 | Douglas et al. ............. 324/658 |
| 6,833,603 B1 | | 12/2004 | Park et al. |
| 6,885,275 B1 | * | 4/2005 | Chang ......................... 336/200 |
| 6,972,635 B2 | * | 12/2005 | McCorquodale et al. ... 331/167 |
| 7,190,161 B2 | * | 3/2007 | Bomya ......................... 324/228 |

OTHER PUBLICATIONS

Title: Record Q Symmetrical Inductors for 10-GHz LC-VCOs in 0.18-um Gate-Length CMOS Author(s): Tiemeijer, et al IEEE Electron Device Letters, vol. 23, No. 12, Dec. 2002—pp. 713-715.
Title: Differentially-Shielded Monolithic Inductors Author(s): Cheung, et al. IEEE 2003 Custom Integrated Circuits Conference—pp. 95-98.
Title: The Comparison and Combination of CMOS Inductor Q-enhancement Techniques Author(s): Murphy, et al. Department of Electrical & Electronic Engineering, University College Cork, College Road, Cork, Ireland IEEE 2003—pp. 94-97.
Title: CMOS Tunable Bandpass RF Filters Utilizing Coupled On-Chip Inductors Author(s): Bantas, et al. National Technical University of Athens, Microelectronic Circuit Design Group, 9, Iroon Politechniou, Athens, Greece IEEE 1999—pp. 581-584.
Title: Novel Si Integrated Inductor And Trans former Structures For RF IC Design Author(s): Koutsoyannopoulos, et al. Microelectronic Circuit Design Group, 9, Iroon Politechniou, Athens, Greece SGS-Thomson Microelectronics, RF Division, DSG, Catania, Italy IEEE 1999—pp. 11-573-11-576.

(Continued)

*Primary Examiner*—Patricia Nguyen
(74) *Attorney, Agent, or Firm*—Steven Capella

(57) ABSTRACT

The present invention provides a differentially driven monolithic inductor circuit having a shield differentially driven by phase shift buffers and a single-ended monolithic inductor circuit having single-ended shields driven by phase shift buffers, both inductor circuit types providing high Quality factor (Q) at operating frequencies in the multi-GHz range and circuits incorporating the same.

20 Claims, 9 Drawing Sheets

OTHER PUBLICATIONS

Title: Performance Limits Of Planar And Multi-Layer Integrated Inductors Author(s): Koutsoyannopoulos, et al. Microelectronic Circuit Design Group, 9, Iroon Politechniou, Athens, Greece ST Microelectronics, RF Division, DSG, Catania, Italy ISCAS 2000—IEEE International Symposium on Circuits and Systems, May 28-31, 2000, Geneva—pp. 11-160-11-163.

Title: Systematic Analysis and Modeling of Integrated Inductors and Transformers in RF IC Design Author(s): Koutsoyannopoulos, et al. IEEE Transactions On circuits And Systems—II: Analog And Digital Signal Processing, vol. 47, No. 8—Aug. 2000 pp. 699-713.

Title: Differentially Driven Symmetric Microstrip Inductors Author(s) Danesh and John R. Long IEEE Transactions On Microwave Theory And Techniques, vol. 50 No. 1, Jan. 2002 pp. 332-341.

Title: Analysis And Synthesis of On-Chip Spiral Inductors Author(s): Talwalkar, et al. IEEE Transactions On Electron Devices, vol. 52, No. 2, Feb. 2005 pp. 176-182.

Title: On-Chip Spiral Inductors With Patterned Ground Shields For Si-Based RF IC's Author(s): Yue, et al. IEEE Journal of Solid-State Circuits, vol. 33, No. 5, May 1998 pp. 743-752.

* cited by examiner

HIGH Q MONOLITHIC INDUCTORS FOR USE IN DIFFERENTIAL CIRCUITS

BACKGROUND OF THE INVENTION

The present invention relates to monolithic inductors, more particularly, to high Quality factor monolithic inductors for use in differential circuits and circuits incorporating the same.

Monolithic inductors are important components for various circuit types such as low-noise amplifiers (LNAs), voltage controlled oscillators (VCOs), filters, impedance matching networks, etc. External components can be minimized when all passive components are integrated on-chip, so monolithic inductors are often used as narrow-band loads in various circuits such as amplifiers, oscillators, and mixers. Monolithic inductors can take either a planar form (e.g. single layer) or spiral form (e.g. where adjacent turns are interconnected by vias).

The quality factor (Q) of an inductor, measured by $2\pi \omega$ [(peak magnetic energy—peak electric energy)/(energy loss in one oscillation cycle)], is primarily limited by conductor losses arising from metallization resistance, the conductive silicon substrate, and parasitic substrate capacitances (which lower the inductor self-resonant frequency). Time-varying magnetic fields penetrate the silicon substrate and cause eddy currents as per Lenz's law, thus resulting in power loss. Additionally, eddy currents create their own magnetic fields that oppose those of the monolithic inductor. This decreases the inductance of the inductor.

Conventional techniques for addressing the negative effects silicon substrates have on inductor Q include applying Q-enhancement through the use of active negative resistance elements (e.g. transconductors in positive feedback), use of high resistivity (>1 k Ω-cm) silicon substrates, and etching a pit in the silicon substrate under the inductors. However, many of these techniques are difficult and expensive to implement with conventional CMOS processing, and additionally, each of these techniques do not provide sufficient Q-enhancement for inductors operating in the multi-GHz frequency range. For example, at 10 GHz, substrate losses are more pronounced than at lower frequencies. Although eddy currents are still negligible when the substrate resistivity is at least 10 Ω-cm, the currents induced in the substrate by the capacitance between the inductor coil and the substrate dissipate energy and reduce the maximum achievable Q. Such capacitive substrate currents are shunted when a highly conductive solid ground shield is inserted between the coil and the substrate. This significantly increases Q at the expense of a somewhat reduced resonance frequency. However, one critical drawback with a solid ground shield is that the shield disturbs the magnetic field of the inductor. According to Lenz's law, image current, also known as loop current, will be induced in the solid ground shield by the magnetic field of the spiral inductor. The image current in the solid ground shield will flow in a direction opposite to that of the current in the spiral. The resulting negative mutual coupling between the currents reduces the magnetic field, and thus the overall inductance. Patterned ground shields overcome this limitation. By patterning the ground shield, the loop current path can be effectively cutoff. However, patterned ground shields allow capacitive current to flow. Additionally, patterned ground shields add capacitance which reduces the resonant frequency of the inductor. Furthermore, the ground line(s) coupled to the patterned shield can have significant currents induced therein, thus decreasing the total magnetic field, the inductance, and inductor Q.

Another conventional technique for further improving inductor Q includes differentially driving an unshielded symmetric spiral inductor with signals (e.g., voltages and currents) that are 180° out of phase (i.e. differential). See, for example, Danesh et al., "Differentially Driven Symmetric Microstrip Inductors," IEEE Transactions on Microwave Theory and Techniques, pp. 332-341, Vol. 50, No. 1, January 2002. By driving an unshielded symmetric inductor with differential signals, the magnetic field produced by the parallel groups of conductors is reinforced and the overall inductance per unit area is increased. FIG. 1 illustrates a conventional unshielded symmetric inductor 100 comprising first coil 110 and second coil 120. Coil 110 can be driven by a signal at port 112 and coil 120 can be driven by a 180° phase-shifted version of the same signal at port 122. Although the voltages on adjacent conducting strips are anti-phase, current flows in the same direction along each adjacent conductor (i.e., signal currents $i_1$ and $i_2$ flow in the same direction on any particular side). The symmetric inductor is realized by joining groups of coupled conductive strips from one side of an axis of symmetry to the other using a number of cross-over and cross-under connections.

At lower frequencies, the input impedance in either a single-ended or differential connection is approximately the same, but as operating frequency increases, parasitic substrate capacitance and resistance become a factor. For differential excitation, parasitic substrate capacitance and resistance have a higher impedance at a given frequency as compared to single-ended excitation. This reduces the real part of the input impedance and increases the reactive component of the input impedance. Therefore, the inductor is improved when driven differentially, and the self-resonant frequency (or usable bandwidth of the inductor) increases due to the reduction in the effective parasitic capacitance.

To further enhance inductor Q, others have augmented the un-shielded differentially driven symmetric inductor concept as illustrated in FIG. 1 with a floating shield formed under the inductor. See, for example, Cheung et al., "Differentially-Shielded Monolithic Inductors," IEEE 2003 Custom Integrated Circuits Conference, Proceedings of the IEEE, pp. 95-98, September 2003. By incorporating a floating shield between a differentially driven symmetric inductor and the substrate, the inductor Q is improved because the parasitic coupling effects of the substrate are reduced as described supra. Because the shield is floating, a virtual ground is realized on the shield.

Alternatively, a single-ended shield formed under a wire can be driven by a buffer amplifier having as close to unity gain and 0° phase shift as possible so to reduce the wiring capacitance between the wire and shield to equivalently zero. See, for example, U.S. Pat. No. 5,616,952 entitled "Semiconductor Device with structure to decrease wiring capacitance" (the '952 patent) and U.S. Pat. No. 6,833,603 (the '603 patent) assigned to the assignee hereof. In the '952 and '603 patents, the shield is driven by the output of a buffer amplifier having approximately the same voltage and phase as the wire or inductor to be shielded. Shunt capacitance can be reduced because it is proportional to the first time derivative of the voltage across the dielectric of the capacitor. In the ideal dynamically shielded inductor, there is no change in voltage across the parasitic shunt capacitance of the inductor coil. This can greatly increase Q. In the past, such as in the '952 and '603 Patents, this has been done using a buffer amplifier comprising either a common drain or common collector, because such devices have 0° phase shift from input to output. Both common drain and common collector are well known in the art. For example, see Gray and Meyer, Analysis and Design of ANALOG INTEGRATED CIRCUITS, $3^{rd}$ Ed. (1993), pp. 210-215, TK7874.G688. However, common drain and common collector configurations have less than unity gain, typically −1 to −2 dB, and require a great deal of power to achieve close to unity gain. The low gain of these buffers makes it difficult to drive a single-ended shield with a sufficiently high enough voltage to realize the benefit in Q without consuming excessive DC power. Two stages of common source/emitter buffers can also be used, but the delay associated with both stages is typically too large to drive the shield effectively, especially at multi-GHz frequencies. Additionally, the bandwidth of common drain and common collector configurations have an upper limit for 0° phase shifted signals, thus limiting the application of such shields. Furthermore, by having the buffer amplifier external to the integrated circuit containing the inductor to be shielded as is the case in the '952 patent severely limits the effective frequency range of circuit to the MHz range due to the long feedback path and the parasitic effects associated with a signal received off-chip.

Therefore, there exists a need for monolithic inductors having a high Quality factor at operating frequencies in the multi-GHz range.

BRIEF SUMMARY OF THE INVENTION

The present invention addresses the above-described problems by providing monolithic inductors having high Quality factor (Q) at operating frequencies in the multi-GHz range and circuits incorporating the same.

In accordance with one aspect of the invention, a circuit comprises a monolithic inductor having first and second ends, the first end adapted to receive a positive signal of a differential signal, the second end adapted to receive a negative signal of the differential signal, a first buffer adapted to receive the positive differential signal and output a phase-shifted version of the positive differential signal, a second buffer adapted to receive the negative differential signal and output a phase-shifted version of the negative differential signal, and a shield positioned between the monolithic inductor and a substrate, the shield having first and second segments, the first shield segment adapted to receive the phase-shifted output of the second buffer, the second shield segment adapted to receive the phase-shifted output of the first buffer.

In accordance with another aspect of the invention, a circuit comprises a first monolithic inductor adapted to receive a positive signal of a differential signal, a second monolithic inductor adapted to receive a negative signal of the differential signal, a first buffer adapted to receive the positive differential signal and output a phase-shifted version of the positive differential signal, a second buffer adapted to receive the negative differential signal and output a phase-shifted version of the negative differential signal, a first shield positioned between the first monolithic inductor and a substrate, the first shield adapted to receive the phase-shifted output of the second buffer, and a second shield positioned between the second monolithic inductor and the substrate, the second shield adapted to receive the phase-shifted output of the first buffer.

In accordance with yet another aspect of the invention, a method of operating a differential circuit comprises receiving a positive signal of a differential signal, receiving a negative signal of the differential signal, phase-shifting the positive differential signal by a first buffer, phase-shifting the negative differential signal by a second buffer, applying the positive and negative differential signals to at least one monolithic inductor, and applying the phase-shifted outputs of the first and second buffers to at least one shield underlying the at least one monolithic inductor.

Further and still other aspects of the present invention will become more readily apparent when the following detailed description is taken in conjunction with the accompanying drawing figures.

DETAILED DESCRIPTION OF PREFERRED EMBODIMENTS OF THE INVENTION

The present invention provides monolithic inductors having high Quality factor (Q) at operating frequencies in the multi-GHz range and circuits incorporating the same.

Figure 1:
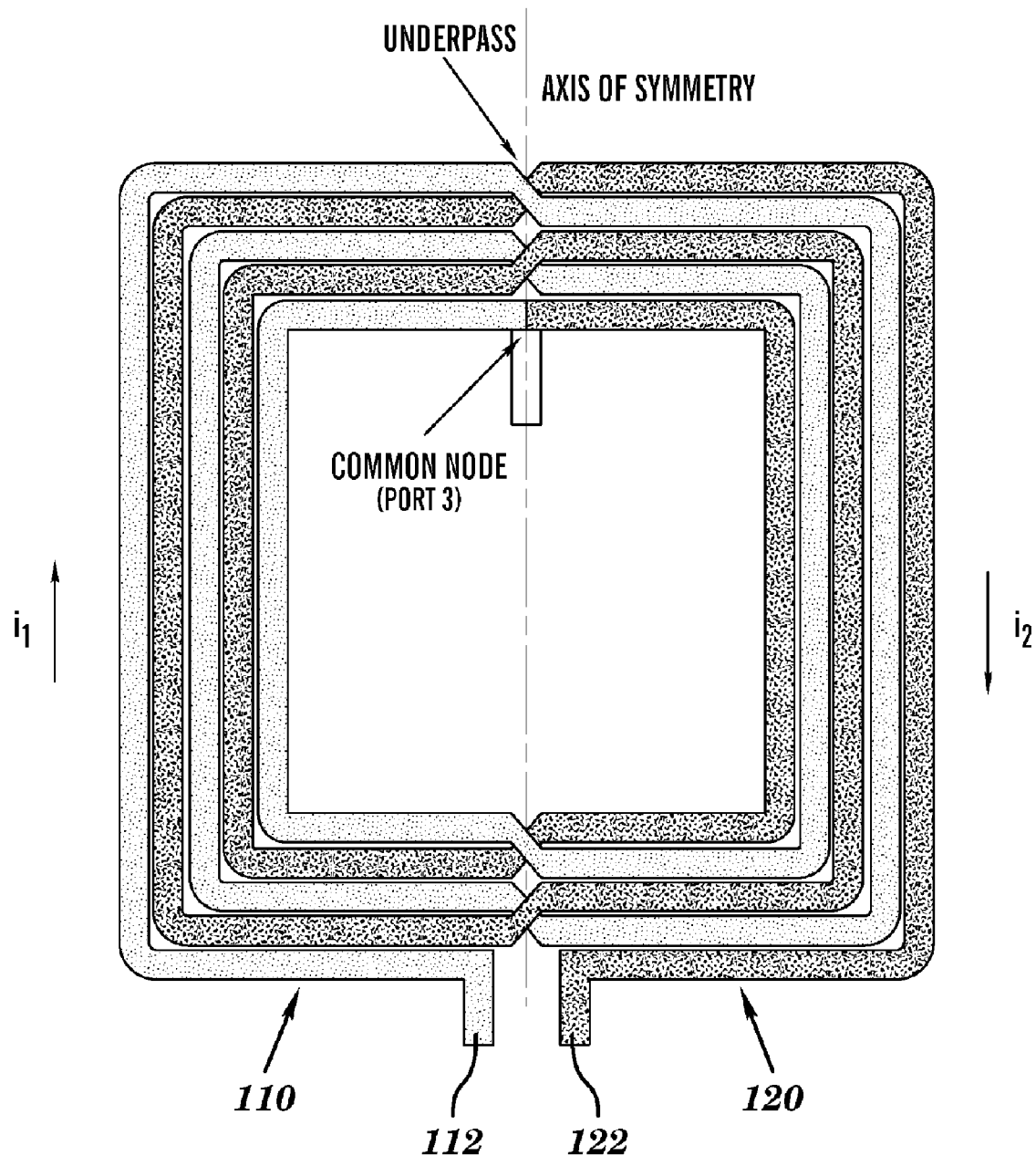
FIG. 1 is a diagram illustrating a conventional unshielded symmetric inductor.
Figure 2:
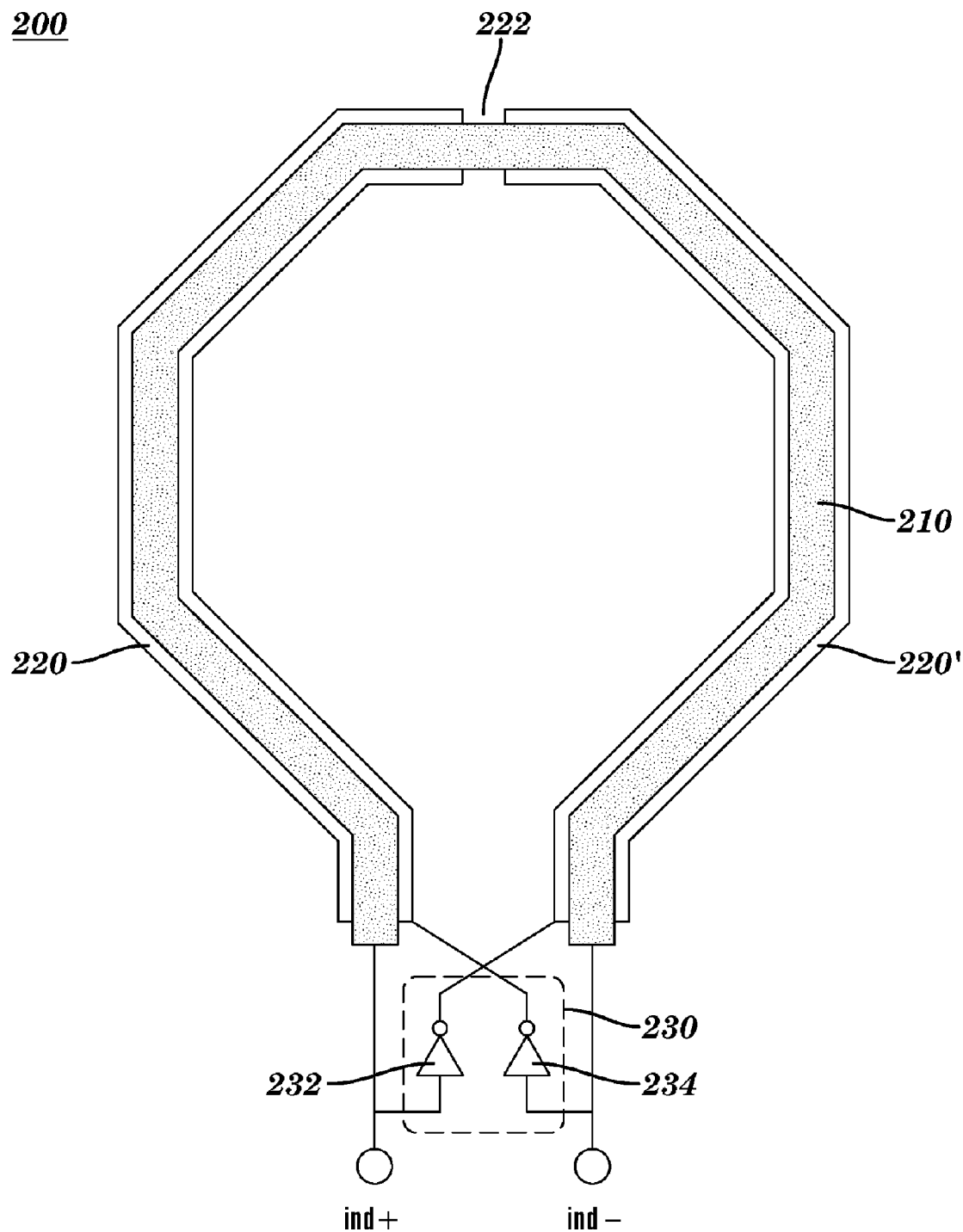
FIG. 2 is a diagram illustrating an exemplary differentially driven monolithic inductor circuit having a shield differentially driven by phase shift buffers according to an embodiment of the present invention.

FIG. 2 illustrates an exemplary differentially driven monolithic inductor circuit having a shield differentially driven by phase shift buffers according to an embodiment of the present invention. The shielded, differentially driven monolithic inductor circuit 200 comprises differentially driven monolithic inductor 210 and a differentially driven shield underlying the inductor, the shield adapted to being differentially driven by phase shift buffers 230, the shield being formed by first shield section 220 and second shield section 220' where the shield sections are separated by gap 222. Differentially driven monolithic inductor 210 can be any suitable monolithic inductor capable of being differentially driven (i.e. having two input ports) and capable of operating in the multi-GHz range. For illustrative purposes only, the inductor can be planar as illustrated in FIG. 2, spiral as illustrated in FIG. 1, or any other suitable configuration. Differentially driven monolithic inductor 210 can comprise any suitable current carrying material. For illustrative purposes only, the inductor can comprise any suitable metal. Preferably, the inductor comprises copper or aluminum so to be compatible with standard Complimentary Metal Oxide Semiconductor (CMOS) processes.

The shield differentially driven by phase shift buffers is positioned between differentially driven monolithic inductor 210 and the underlying substrate (not shown). The shield is separated from the substrate by an insulating layer (also not shown). Also, the shield is separated from the inductor by an insulating layer. The insulating layers can comprise and suitable insulating material. For example, the insulating layers can comprise normal-k, low-k, or high-k insulators. For illustrative purposes only, the insulating layers can comprise $SiO_2$, SiN, organic and inorganic low-k insulators such as Fluorine-doped silicate glass (FSG), hydrogen silsesquioxane (HSQ), Amorphous Fluorinated Carbon, Parylene, BCB, Flare, SiLK, Xerogel, porous silicon oxycarbide films (SiOCH), Black Diamond (low density silicon dioxide-like material), HSQ, Xerogel or Aerogel or any suitable combination thereof. The semiconductor substrate can be formed from any suitable semiconductor material such as bulk silicon, silicon-on-insulator ("SOI"), SiGe, GaAs, or the like.

The shield differentially driven by phase shift buffers can be any suitable structure capable of being differentially driven (i.e. having two input ports) and capable of effectively shielding the differentially driven monolithic inductor from the underlying substrate. The shield should be at least as wide as the inductor to effectively block the electric fields generated by the inductor from entering the underlying substrate. The shield differentially driven by phase shift buffers can comprise any suitable current carrying material. For illustrative purposes only, the shield can comprise any suitable metal. Preferably, the shield comprises copper or aluminum to be compatible with standard CMOS processes. The shield can be positioned entirely under the inductor, or optionally, the shield can be positioned under the inductor and also have regions that extend upward from its sides to more efficiently block electric fields emanating from the side regions of the inductor.

Figure 3B:
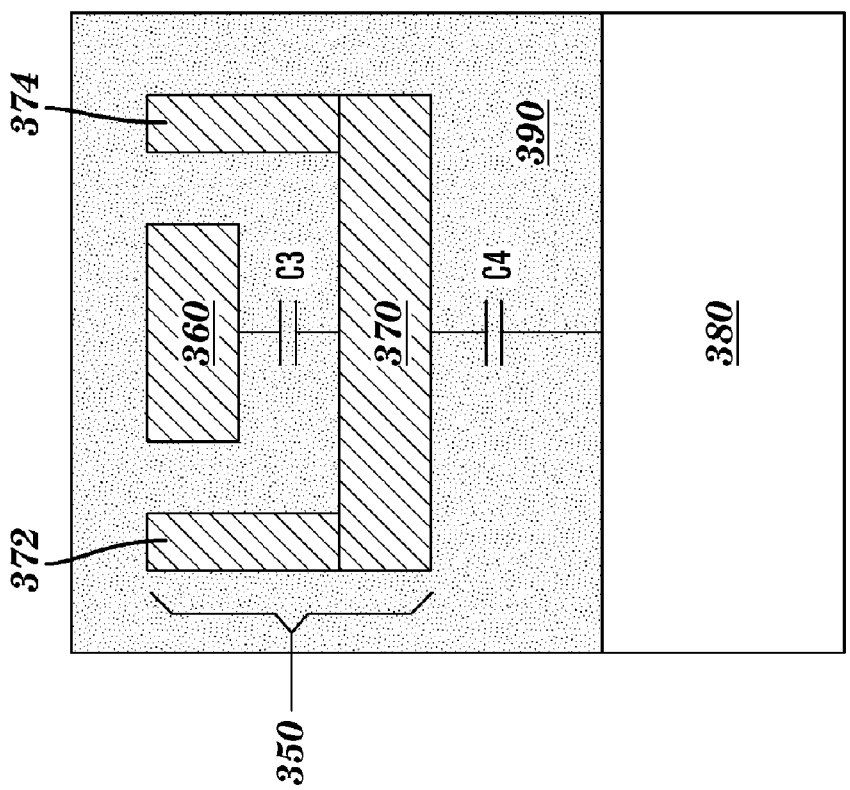
FIG. 3B is a diagram illustrating a cross-sectional view of an exemplary differentially driven monolithic inductor circuit having a shield differentially driven by phase shift buffers according to another embodiment of the present invention.
Figure 3A:
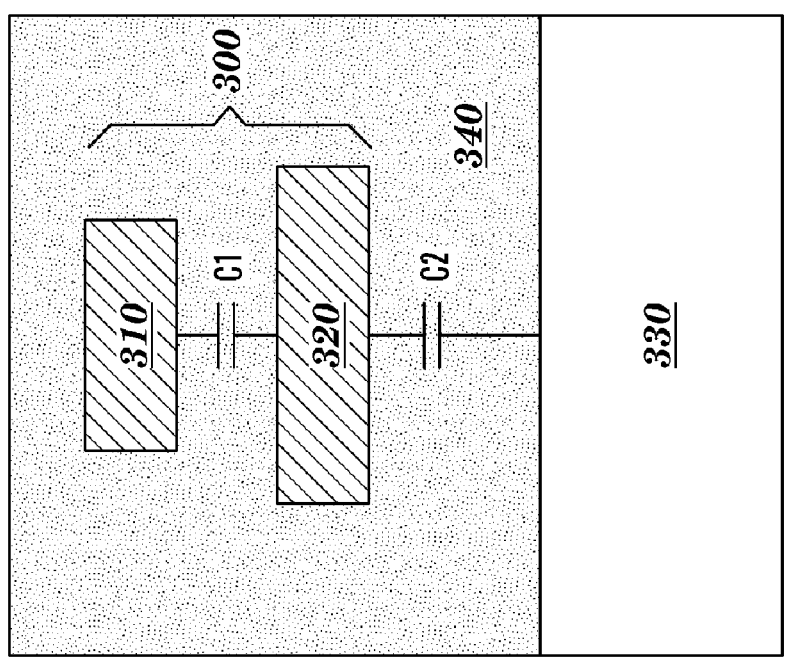
FIG. 3A is a diagram illustrating a cross-sectional view of an exemplary differentially driven monolithic inductor circuit having a shield differentially driven by phase shift buffers according to an embodiment of the present invention.

FIG. 3A illustrates a cross-sectional view of an exemplary differentially driven monolithic inductor circuit having a shield differentially driven by phase shift buffers according to an embodiment of the present invention where the shield is planar and positioned entirely under the inductor. The shielded, differentially driven monolithic inductor 300 comprises differentially driven monolithic inductor 310 and a shield 320 differentially driven by phase shift buffers. The inductor and shield are positioned above substrate 330. Insulating material 340 separates the inductor from both the shield and the substrate. The width of shield 320 is at least that of inductor 310 to effectively block the electric field generated by the inductor from entering the underlying substrate. Preferably, shield 320 is sufficiently wide enough to inhibit parasitic fringe capacitance generated by the overlying inductor. As a result, the shunt capacitance from inductor 310 to substrate 330 becomes negligible. Instead, first shunt capacitance C1 from inductor 310 to shield 320 and second shunt capacitance C2 from the shield to substrate 330 arise. However, so long as the voltage difference between the inductor and the shield remains approximately zero, shunt capacitance C1 is negligible, or at least minimized. The instantaneous current flowing through a capacitor (i) is measure by i=C dv/dt where C=capacitance and dv/dt equals the instantaneous rate of voltage change. So long as the voltage difference between the inductor and shield is relatively zero, no current will flow in the capacitor. In other words, with no change in voltage, there is no need for any electron motion to add or subtract charge from the plates of capacitor C1, and thus there will be no current. When no current flows in shunt capacitor C1, the shunt capacitance is minimized, bandwidth is improved, and the parasitic loss to the substrate is minimized or eliminated. By minimizing the parasitic shunt capacitance, inductor Q is improved. Shunt capacitor C2 will have an effect between shield 320 and substrate 330. However, shunt capacitor C2 has no effect on inductor 310 or its Q so long as shield 320 is driven with a sufficient voltage. If the shield is not driven with a sufficient voltage, shunt capacitor C2 can cause the shield voltage level to become unmatched with that of the inductor, thus enabling shunt capacitor C1 to adversely impact the inductor's Q.

FIG. 3B illustrates a cross-sectional view of an exemplary differentially driven monolithic inductor circuit having a shield differentially driven by phase shift buffers according to another embodiment of the present invention where the shield is planar and positioned under the inductor and also includes regions extending upward from its side regions to block electric fields emanating from the sides of the inductor (e.g. fringe capacitance). The shielded, differentially driven monolithic inductor 350 comprises differentially driven monolithic inductor 360 and a shield 370 differentially driven by phase shift buffers. The inductor and shield are positioned above substrate 380. Insulating material 390 separates the inductor from both the shield and the substrate. The width of shield 370 is at least that of inductor 360 to effectively block the electric field generated by the inductor as described supra. Preferably, shield 370 is sufficiently wide enough to inhibit parasitic fringe capacitance generated by the overlying inductor. In addition, shield 370 includes regions 372 and 374 that extend upward from its side regions to block the electric fields emanating from the side regions of inductor 360. As a result, the shunt capacitance from inductor 360 to substrate 380 is further minimized by inhibiting parasitic fringe capacitance. Shunt capacitances C3 and C4 manifest themselves, and can be minimized, as described supra in accordance with FIG. 3A.

Returning to FIG. 2, phase shift buffers 230 drive the shield with sufficient voltage, i.e. drive the voltage across the shunt capacitance between the shield and underlying substrate as described supra. Phase shift buffers 230 can comprise any suitable buffer capable of driving the shield with sufficient voltage, i.e. drive the voltage across the shunt capacitance between the shield and underlying substrate. For operating frequencies in the multi-GHz range, phase shift buffers 230 preferably comprise common source or common emitter based buffers such as CMOS or bipolar based inverter buffers. Most preferably, phase shift buffers 230 comprise common source based buffers such as CMOS inverter buffers to be fully compatible with CMOS circuitry.

Unlike conventional approaches which are limited to buffers having zero phase-shift and close to unity gain such as common drain or common collector based buffers, common source or common emitter or differential pair based buffers can drive the shield of the present invention despite the phase shift associated with these respective buffer types. This is so because the differential input signal to each shield segment is phase-shifted by one or more phase shift buffers such that approximately no voltage difference exists between each shield segment and the region of the monolithic inductor overlying each segment. Although common source and common emitter based buffers provide high gain (i.e. greater than unity gain), their outputs are approximately 180° phase-shifted versions of their inputs. However, this phase shifting is negated because the outputs of phase shift buffers 230 are coupled to the shield in such a way that the voltage difference between the inductor and underlying shield is approximately zero. By coupling the outputs of buffers 230 in this way, the phase shift induced by buffers 230 is essentially negated. Thus, the input to a particular shield segment is phase-shifted so that it is approximately in-phase with the signal driving the overlying inductor. As described supra, the voltage difference between differentially driven monolithic inductor 210 and the shield should be negligible to minimize shunt capacitance between the inductor and shield, thus maximizing the inductor's Q.

For example, the output of first phase shift buffer 232 is coupled to second shield segment 220'. As such, second shield segment 220' is driven by the phase-shifted output of first phase shift buffer 232, which is approximately a buffered, 180° phase shifted version of ind+. Thus, the output of first phase shift buffer 232 is approximately ind−. The section of inductor 210 overlying second shield segment 220' is driven by ind−. Therefore, second shield segment 220' and the section of inductor 210 overlying second shield segment 220' are driven at approximately the same voltage, thus minimizing shunt capacitance between the inductor and shield. Likewise, first shield segment 220 and the section of inductor 210 overlying first shield segment 220 are driven at approximately the same voltage, thus minimizing shunt capacitance between the inductor and shield.

During operation, a differential signal is received by monolithic inductor 210. The differential signal comprises a positive signal and a negative signal, where the negative signal is the complement, or phase-shifted version of the positive signal. For example, positive differential input voltage signal ind+ is received by a first end of differentially driven monolithic inductor 210 and its complement ind−, a 180° phase shifted version of ind+, is received by a second end of inductor 210. First phase shift buffer 232 also receives ind+, amplifies it, and outputs a phase-shifted amplified signal. The output of first phase shift buffer 232 is approximately a 180° phase shifted version of ind+, thus, the phase-shifted buffered output that drives second shield section 220' is approximately equivalent to ind−. Similarly, second phase shift buffer 234 receives ind−, amplifies it, and outputs a phase-shifted amplified signal. The output of second phase shift buffer 234 is approximately a 180° phase shifted version of ind−, thus, the phase-shifted buffered output that drives first shield section 220 is approximately equivalent to ind+. By coupling the output of first phase shift buffer 232 to second shield section 220' and by coupling the output of second phase shift buffer 234 to first shield section 220, the voltage difference between differentially driven monolithic inductor 210 and the shield is negligible as described supra, thus minimizing shunt capacitance between the inductor and shield and maximizing the inductor's Q.

Coupling the outputs of common source or common emitter based buffers to a differentially driven shield as described supra is preferred over conventional techniques that incorporate driving shields with common drain or common collector based buffers because common source and common emitter based devices have substantially greater than unity gain. Gain for a common source device is determined according to the following formula: $V_{OUT}/V_{IN}=(1+Rds+Rds\times gm)/R_S$ where $V_{OUT}/V_{IN}=Rds/R_S$ when $Rds\times gm<<Rds$.

Gain for a common emitter device is determined according to the following equation: $V_{OUT}/V_{IN}=-\alpha R_L/[R_B+(\beta+1)(r_E+R_E)]$. Common drain and common collector devices have less than, or close to, unity gain. Gain for a common drain device is determined according to the following equation: $V_{OUT}/V_{IN}=(gm\times R_S)/(gm\ R_S+1)$ where $V_{OUT}=V_{IN}$ when the product of $gm\ R_S>>1$. The gain of common collector device is determined according to the following equation: $V_{OUT}/V_{IN}=R_E\|R_L/r_E+R_E\|R_L$.

Because the buffers of the present invention which drive the shield have greater than unity gain, the shield can be sufficiently driven at frequencies in the multi-GHz range, thus minimizing shunt capacitance between the shield and the inductor coils at high frequencies. By minimizing such shunt capacitance, the overlying differentially driven monolithic inductor can be operated in the multi-GHz range with a substantially improved Q. For example, a conventional CMOS inverter buffer improves drive capability by approximately doubling the voltage applied to the differential shield and also increases the operating bandwidth of the shield. Another benefit of using a shield differentially driven by phase shift buffers for minimizing shunt capacitance is that the buffers supplying power to the shield do not have to drive the entire shield. Instead, the shield is segmented and each segment is driven by a separate buffer, thus reducing the power requirements placed on each buffer. For example, FIG. 2 illustrates a shield differentially driven by phase shift buffers having a first shield segment 220 separated from a second shield segment 220' by gap 222. Therefore, first buffer 232 need only drive second shield segment 220' and second buffer 234 need only drive first shield segment 220. Conventional single-ended shields require the buffer driving the shield to supply sufficient power to the entire shield. This constraint, coupled with less than unity gain associated with common drain and common collector based buffers, reduces the effective frequency range of inductors shielded by conventional single-ended shields to the MHz and low-GHz frequency operating range.

Figure 4:
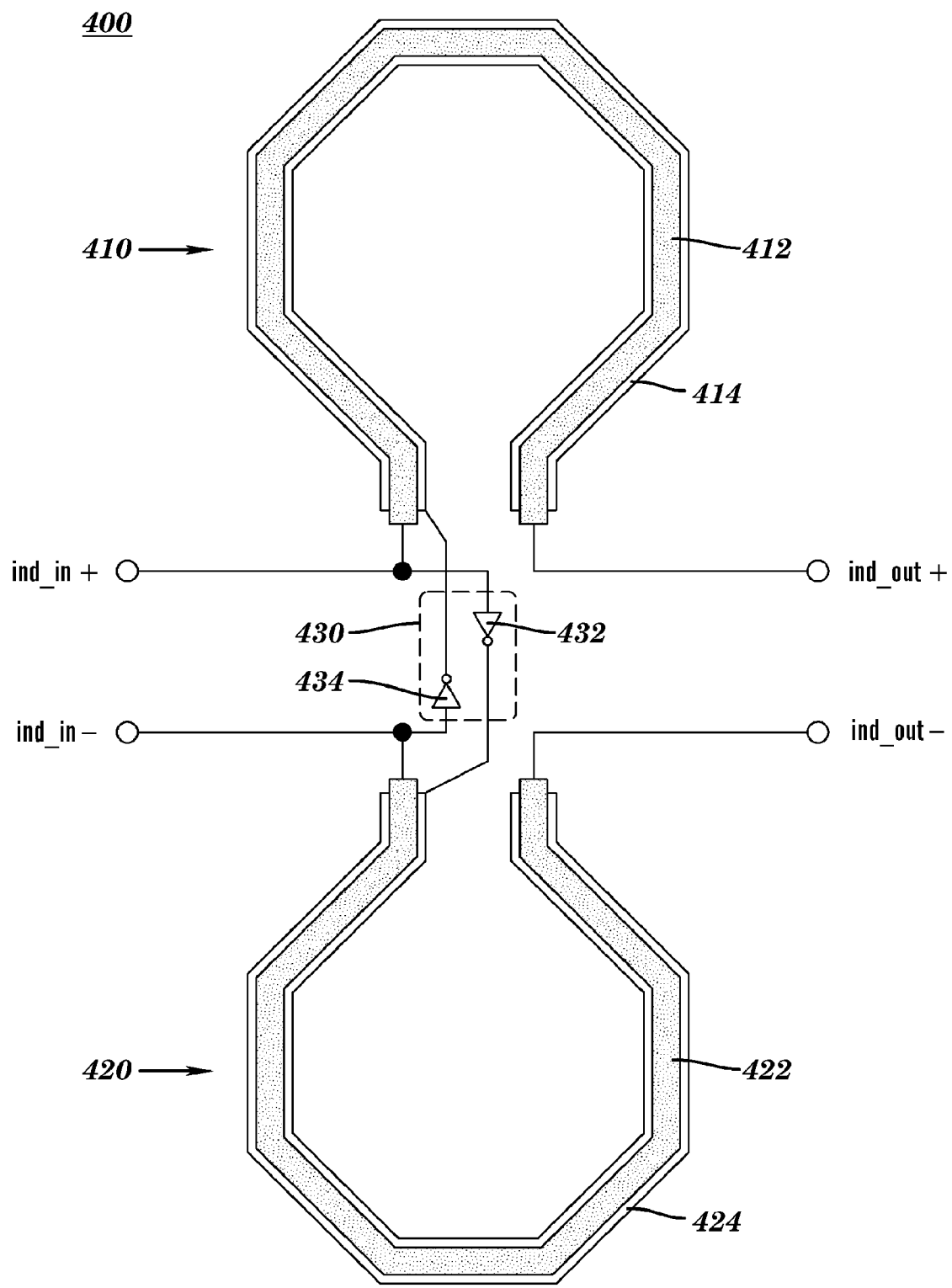
FIG. 4 is a diagram illustrating an exemplary single-ended monolithic inductor circuit having single-ended shields driven by phase shift buffers according to an embodiment of the present invention.

FIG. 4 illustrates an exemplary single-ended monolithic inductor circuit having single-ended shields driven by phase shift buffers according to an embodiment of the present invention. The shielded, single-ended monolithic inductor circuit 400 comprises shielded single-ended monolithic inductors 410 and 420 and phase shift buffers 430. Shielded, single-ended monolithic inductor 410 comprises single-ended inductor 412 and single-ended shield 414, the single-ended shield being driven by phase shift buffer 434. Likewise, shielded, single-ended monolithic inductor 420 comprises single-ended inductor 422 and single-ended shield 424, the single-ended shield being driven by phase shift buffer 432. The inductors, shields, substrate (not shown) and insulating layers (also not shown) can comprise any of the materials and structures described supra in accordance with the shielded, differentially driven monolithic inductor embodiment.

Unlike the shielded, differentially driven monolithic inductor embodiment of the present invention described supra, the inductors and shields comprising the shielded, single-ended monolithic inductor embodiment of the present invention are not driven by both the positive and negative signal of a differential signal. Instead, a first single-ended inductor is driven by the positive signal of a differential signal and a first single-ended shield underlying the first inductor is driven by a phase-shifted, buffered version of the negative differential signal so that the voltage difference between the inductor and shield is approximately zero as described supra. Likewise, a second single-ended inductor is driven by the negative differential signal and a second single-ended shield underlying the second inductor is driven by a phase-shifted, buffered version of the positive differential signal so that the voltage difference between the second inductor and second shield is also approximately zero.

For example, phase shift buffers 430 drive single-ended shields 414 and 424 with sufficient voltage, i.e. drive the voltage across the shunt capacitance between the shields and underlying substrate as described supra. Phase shift buffers 430 can comprise any suitable buffer capable of driving the shields with sufficient voltage as described supra, i.e. drive the voltage across the shunt capacitance between the shield and underlying substrate. For operating frequencies in the multi-GHz range, phase shift buffers 430 preferably comprise common source or common emitter based buffers such as CMOS or bipolar based inverter buffers. Most preferably, phase shift buffers 430 comprise common source based buffers such as CMOS inverter buffers to be fully compatible with CMOS circuitry.

The output of first phase shift buffer 432 is coupled to second single-ended shield 424. As such, second shield 414 is driven by the phase-shifted output of first phase shift buffer 432, which is approximately a buffered, 180° phase shifted version of ind+. Thus, the output of first phase shift buffer 432 is approximately ind−. Second monolithic inductor 422 overlying second shield 424 is driven by ind−. Therefore, second shield 424 and second monolithic inductor 422 are driven at approximately the same voltage as described supra, thus minimizing shunt capacitance between the inductor and shield. Likewise, first single-ended shield 214 and first monolithic inductor 412 are driven at approximately the same voltage, thus minimizing shunt capacitance between the inductor and shield.

During operation, a positive differential input voltage signal ind_in+ is received by first single-ended monolithic inductor 412 and a negative differential input voltage ind_in−, a 180° phase shifted version of ind_in+, is received by second single-ended monolithic inductor 422. First phase shift buffer 432 also receives ind_in+, amplifies it, and outputs a phase-shifted amplified signal. The output of first phase shift buffer 432 is approximately a 180° phase shifted version of ind_in+, thus, the phase-shifted buffered output that drives single-ended shield 424 is approximately equivalent to ind_in−. Similarly, second phase shift buffer 234 receives ind_in−, amplifies it, and outputs a phase-shifted amplified signal. The output of second phase shift buffer 434 is approximately a 180° phase shifted version of ind_in−, thus, the phase-shifted buffered output that drives first single-ended shield 414 is approximately equivalent to ind_in+. By coupling the output of first phase shift buffer 432 to second shield 424, the voltage difference between inductor 422 and shield 424 is negligible as described supra. Likewise, by coupling the output of second phase shift buffer 434 to first shield 414, the voltage difference between inductor 412 and shield 414 is negligible as described supra. Therefore, the shunt capacitance of shielded, single-ended monolithic inductors 410 and 420 is negligible as described supra, thus maximizing each inductor's Q.

Figure 5:
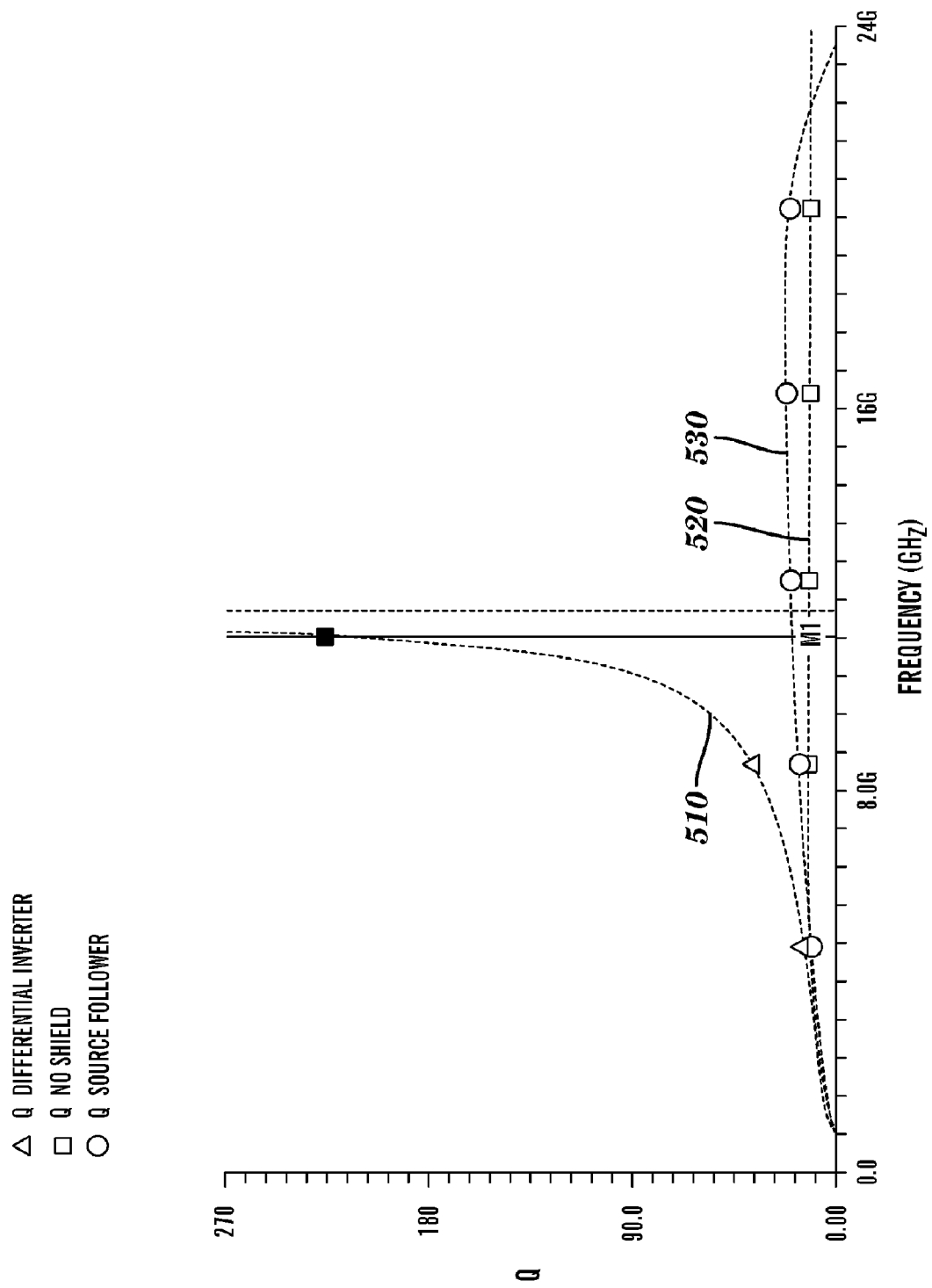
FIG. 5 is a plot illustrating inductor Q versus frequency for various shielded and un-shielded inductors.

FIG. 5 illustrates a plot of inductor Q versus frequency for various shielded and un-shielded inductors. The shielded, differentially driven and single-ended monolithic inductor circuit embodiments of the present invention provide much improved Q, particularly at higher frequencies. Curve 510 is a plot of Q for the shielded, differentially driven monolithic inductor circuit of the present invention. Curve 520 is a plot of Q for a conventional unshielded single-ended inductor. Curve 530 is a plot of Q for a conventional dynamically shielded inductor driven by a common drain buffer where the shield is single-ended. At frequencies of approximately 6 GHz and above, the shielded, differentially driven monolithic inductor circuit of the present invention has a substantially higher Q as compared to conventional inductor structures. For example, at 11.2 GHz, the shielded, differentially driven monolithic inductor circuit of the present invention has a Q of 224.7 as compared to a Q of 12.8 for the conventional unshielded inductor and a Q of 19.0 for the conventional common drain driven shielded inductor.

As described supra, time-varying magnetic fields generated by an inductor can penetrate the silicon substrate and cause eddy currents as per Lenz's law if not properly shielded. These eddy currents create their own magnetic fields that oppose those of the monolithic inductor. This decreases the inductance of the inductor. Decreased inductance negatively impacts Q per the following equation: $Q=(2*pi*f*L)/R$. By minimizing the shunt capacitance between the inductor and underlying substrate as described supra, the shielded, differentially driven and single-ended monolithic inductor circuit embodiments of the present invention provide substantial Q improvement at frequencies in the multi-GHz range.

The shielded, differentially driven and single-ended monolithic inductor circuits of the present invention can be incorporated into any suitable differential circuit requiring high-Q inductors for purposes such as filtering, phase noise reduction, jitter reduction, resistive component noise reduction, etc. For example, the shielded, differentially driven and single-ended monolithic inductor circuits of the present invention can be incorporated into any suitable differential circuit requiring high-Q inductors such as Voltage Controlled Oscillators (VCOs), Low Noise Amplifiers (LNA), differential filters, LC-tank circuits or any other differential circuits requiring high Q. For example, the shielded, differentially driven and single-ended monolithic inductor circuits of the present invention can be incorporated into an LC-tank VCO.

Figure 6:
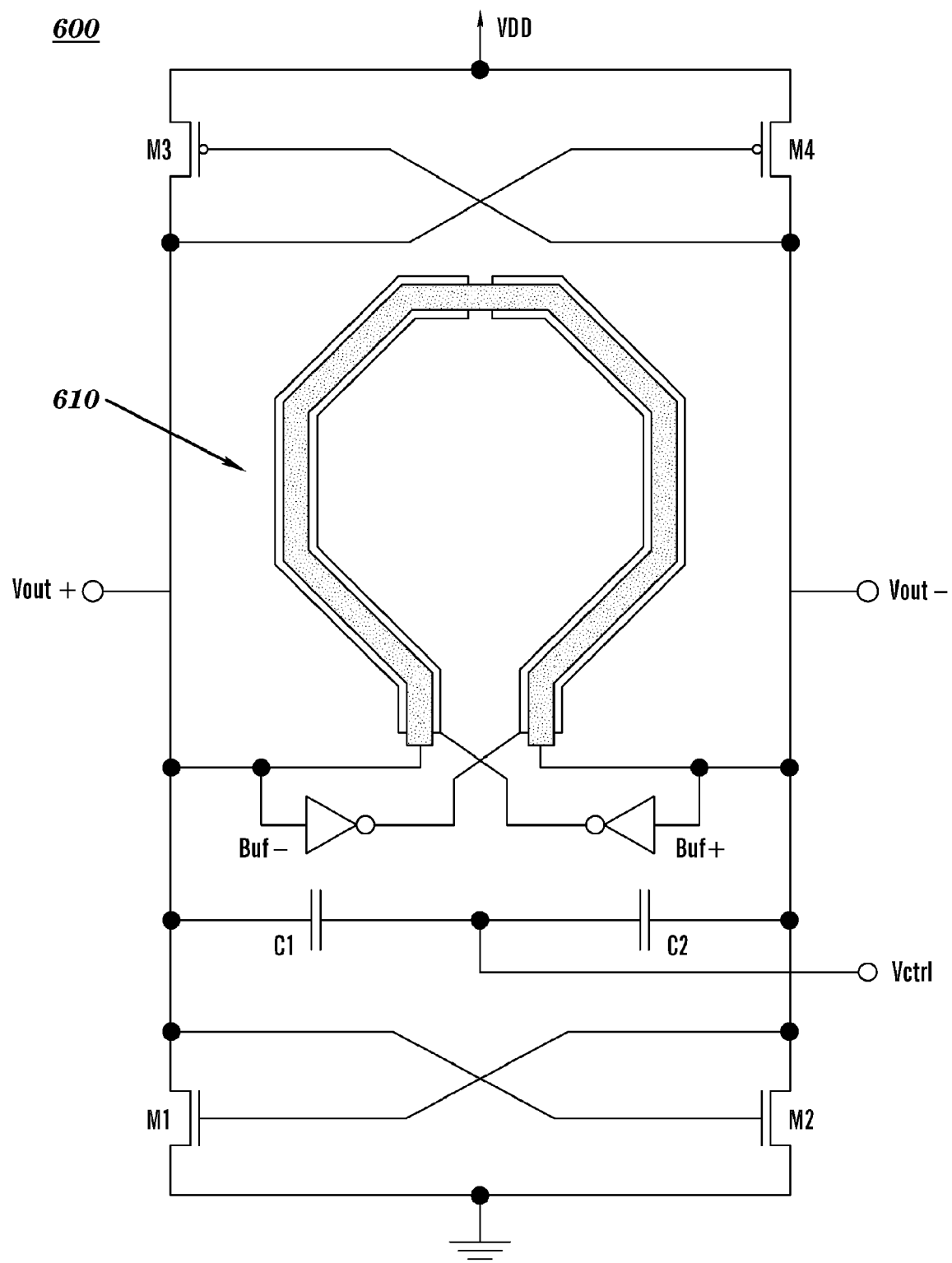
FIG. 6 is a diagram illustrating an exemplary LC-tank VCO circuit incorporating the shielded, differentially driven monolithic inductor circuit of the present invention.

For illustrative purposes only, FIG. 6 illustrates exemplary LC-tank VCO circuit 600 incorporating the shielded, differentially driven monolithic inductor circuit of the present invention. Any conventional LC-tank VCO circuit can be adapted to include the shielded, differentially driven and single-ended monolithic inductor circuits of the present invention. For example, cross-coupled n-FET transistors M1 and M2 provide negative resistance to cancel the losses presented by the parallel LC tank at resonance. Cross-coupled p-FET transistors M3 and M4 increase the loop gain of VCO 600. Also, the p-FET transistors allow better symmetry to be achieved on each of the resonant nodes, thus helping to reduce phase noise. An LC-tank, or resonator, is formed by capacitors C1 and C2 and differentially driven monolithic inductor circuit 610 having a shield differentially driven by phase shift buffers. Differential inputs ind+ and ind− drive the inductor and shield of differentially driven monolithic inductor circuit 610 as described supra to minimize parasitic capacitances. Capacitors C1 and C2 could also be varactors. For example, varactors implemented by standard NMOS gate capacitors operated near threshold could be substituted for capacitors C1 and C2. The VCO output frequency can be tuned by applying a control voltage Vctrl to capacitors C1 and C2 as illustrated in FIG. 6. The phase noise of VCO 600 is dependant on the Q of the complete tank circuit (including the capacitors/varactors and transistors in the negative transconductance circuit) and any parasitic capacitance associated with the circuit layout. The tank Q appears in Leeson's equation for determining the phase noise of an oscillator as follows:

$$10\log\left\{\frac{2FkT}{P_s}\cdot\left[1+\left(\frac{\omega_0}{2Q\Delta\omega}\right)^2\right]\cdot\left(1+\frac{\omega_{1/f^3}}{\Delta\omega}\right)\right\}$$

Because of loss in the capacitors/varactors and other parasitic capacitance and resistance associated with VCO 600, a 20× improvement in inductor Q as realized by the present invention at multi-GHz frequencies will not necessarily translate to the same dramatic improvement in VCO phase noise. However, LC-tank VCO circuits incorporating the shielded, differentially driven and single-ended monolithic inductor circuits of the present invention can expect phase noise improvement.

Figure 7:
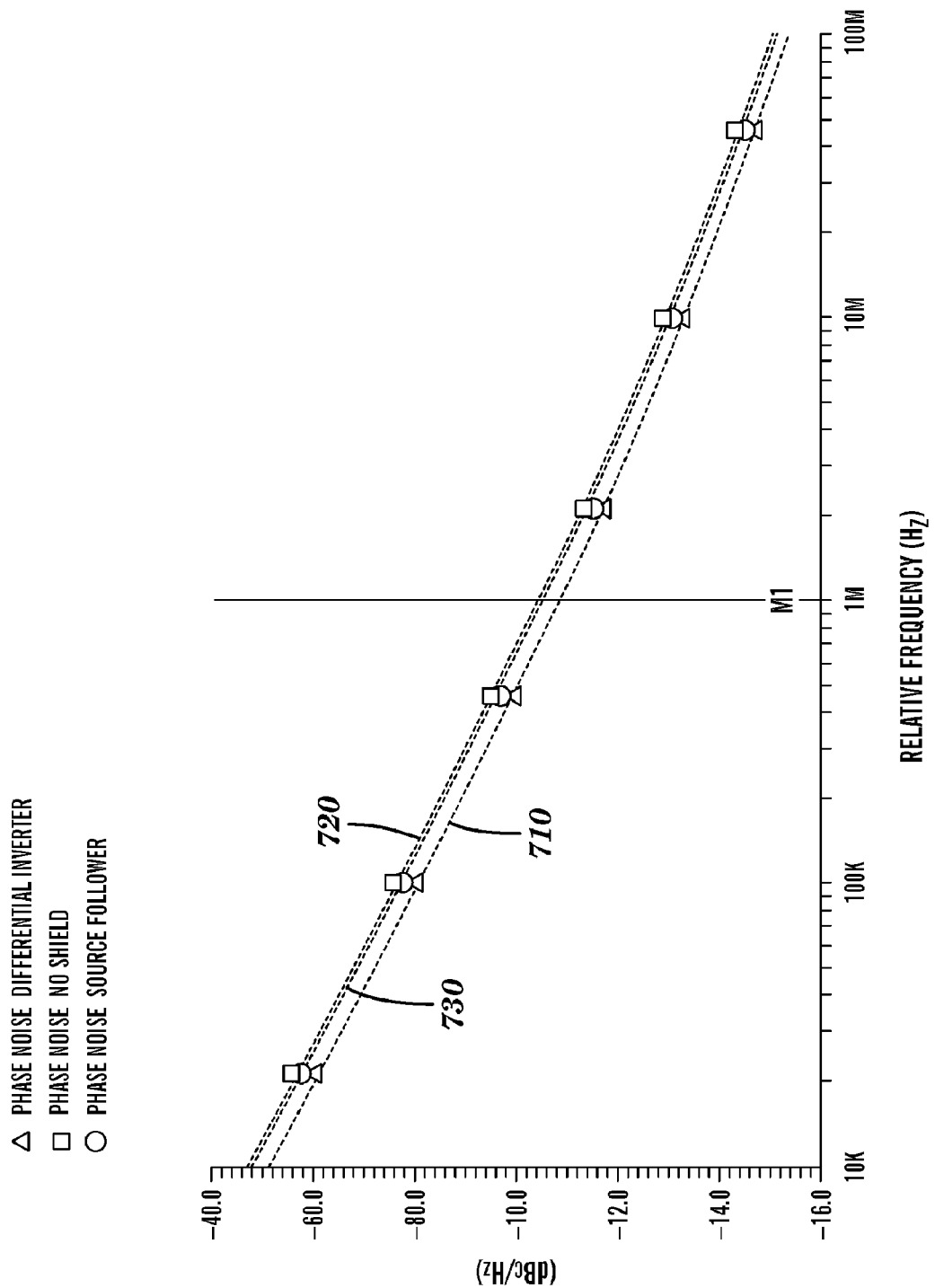
FIG. 7 is a plot illustrating simulated phase noise for various LC-tank VCOs having shielded and un-shielded inductors.

FIG. 7 illustrates a plot of simulated phase noise for various LC-tank VCOs having shielded and un-shielded inductors. Curve 710 represents simulated phase noise of an LC-tank VCO containing the shielded, differentially driven monolithic inductor circuit of the present invention. Curve 720 represents simulated phase noise of an LC-tank VCO containing a conventional unshielded inductor. Curve 730 represents simulated phase noise of an LC-tank VCO containing a conventional dynamically shielded inductor driven by a common drain buffer where the shield is single-ended. The VCOs are differential CMOS-based architectures having identical FET and varactor sizes. Phase noise should be compared among oscillators at the same carrier frequency, thus, the inductor size was varied slightly. Such a variation is necessary to counter the slight differences in effective inductance in the dynamically shielded inductors. The phase noise at 1 MHz offset for the VCO with no shield on the inductor, the VCO with the common drain buffer on the inductor shield, and the VCO containing the shielded, differentially driven monolithic inductor circuit of the present invention are: −104.9 dBc/Hz, −105.6 dBc/Hz, and −109.1 dB/Hz, respectively. According to simulation, the shielded, differentially driven monolithic inductor circuit of the present invention improves the phase noise of the VCO by just over 4 dBc/Hz.

Figure 8:
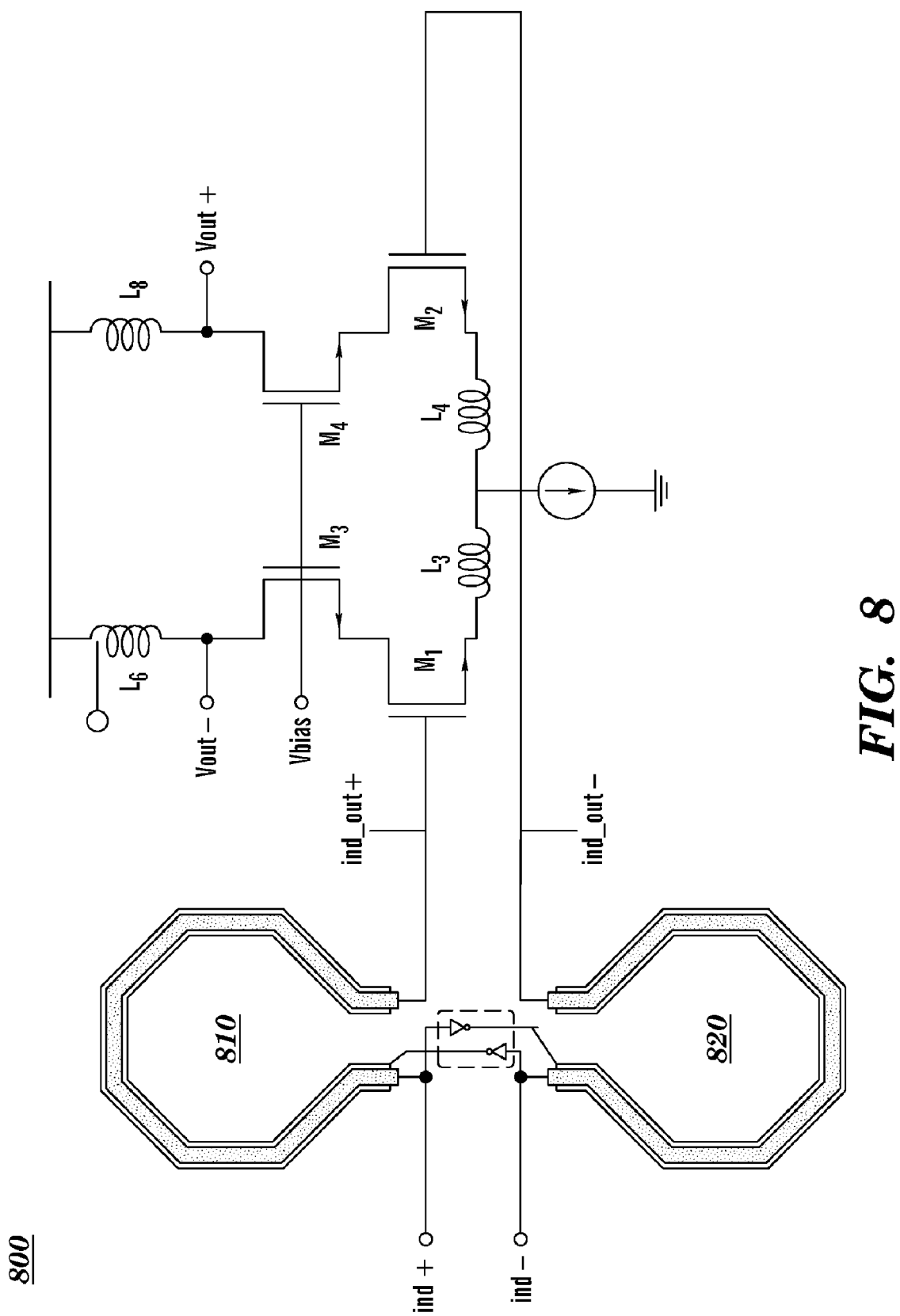
FIG. 8 is a diagram illustrating an exemplary inductively-degenerated LNA circuit incorporating the shielded, single-ended monolithic inductor circuit of the present invention.

For illustrative purposes only, FIG. 8 illustrates exemplary inductively-degenerated LNA circuit 800 incorporating the shielded, single-ended monolithic inductor circuit of the present invention. Any conventional inductively-matched LNA circuit can be adapted to include the shielded, single-ended monolithic inductor circuit of the present invention. Inductors L3 and L4 help to achieve 50-Ohm input matching while load inductors L5 and L6 provide impedance matching at the LNA output. Inductors L3, L4, L5, and L6 minimally impact the noise figure of LNA 800, and as such, can be formed from any conventional inductor. Input impedance matching is performed through single-ended monolithic inductor circuits 810 and 820, each circuit having a single-ended shield driven by a phase shift buffer. Because the LNA noise figure is affected most significantly by inductors 810 and 820, only inductors 810 and 820 have shields driven by phase shift buffers. Differential inputs ind+ and ind− drive the phase shift buffers of the opposite single-ended monolithic inductor circuits 810 and 820 as described supra to minimize parasitic capacitances and maximize inductor Q. MOS transistors M1, M2, M3, and M4 form a cascode circuit providing high gain and isolation in the LNA circuit 800.

Figure 9:
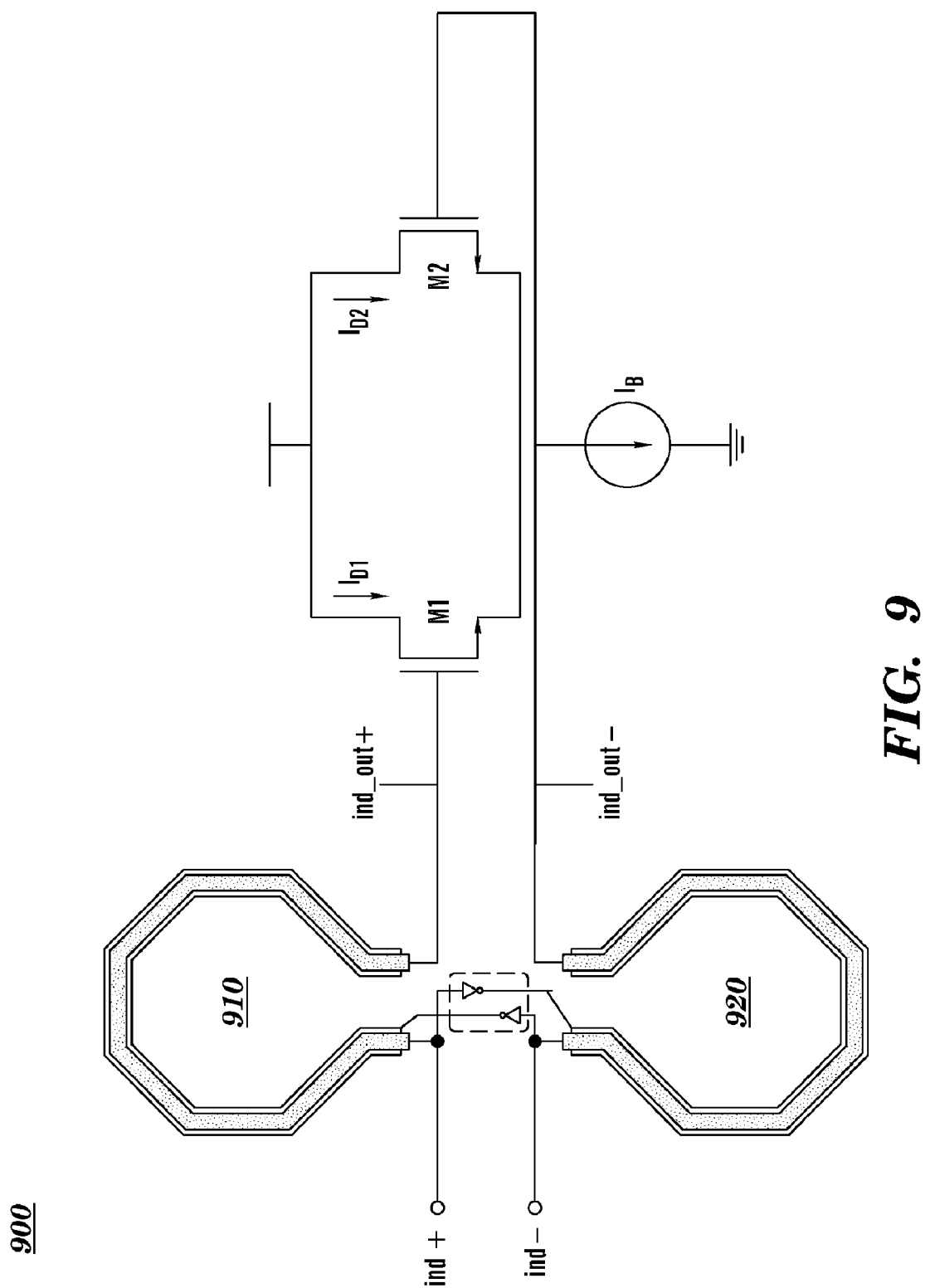
FIG. 9 is a diagram illustrating an exemplary differential filter circuit incorporating the shielded, single-ended monolithic inductor circuit of the present invention.

For illustrative purposes only, FIG. 9 illustrates exemplary differential filter circuit 900 incorporating the shielded, single-ended monolithic inductor circuit of the present invention. Any conventional differential filter can be adapted to include the shielded, single-ended monolithic inductor circuit of the present invention. MOS transistors M1 and M2 increase the transconductance of filter 900. Input tuning is performed through the single-ended monolithic inductor circuits 910 and 920, each circuit having a single-ended shield driven by a phase shift buffer. Differential inputs ind+ and ind− drive the inductor and shield of single-ended monolithic inductor circuits 910 and 920 as described supra to minimize parasitic capacitances and maximize inductor Q.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A circuit comprising:
   a monolithic inductor having first and second ends, the first end adapted to receive a positive signal of a differential signal, the second end adapted to receive a negative signal of the differential signal;
   a first buffer adapted to receive the positive differential signal and output a phase-shifted version of the positive differential signal;
   a second buffer adapted to receive the negative differential signal and output a phase-shifted version of the negative differential signal; and
   a shield positioned between the monolithic inductor and a substrate, the shield having first and second segments, the first shield segment adapted to receive the phase-shifted output of the second buffer, the second shield segment adapted to receive the phase-shifted output of the first buffer.

2. The circuit of claim 1, wherein the monolithic inductor comprises an inductor element selected from the group consisting of spiral and planar.

3. The circuit of claim 1, wherein the first and second buffers comprise devices selected from the group consisting of common source and common emitter.

4. The circuit of claim 1, wherein the first and second buffers each comprise at least one Complimentary Metal Oxide Semiconductor (CMOS) inverter buffer.

5. The circuit of claim 1, wherein the substrate comprises a material selected from the group consisting of semiconductors, bulk silicon, silicon-on-insulator, SiGe, and GaAs.

6. The circuit of claim 1, wherein the shield is separated from the monolithic inductor and the substrate by insulating material, wherein the insulating material comprises a material selected from the group consisting of SiO2, SiN, organic low-k insulators, inorganic low-k insulators, Fluorine-doped silicate glass, hydrogen silsesquioxane, Amorphous Fluorinated Carbon, Parylene, BCB, Flare, SiLK, Xerogel, porous silicon oxycarbide films, Black Diamond, HSQ, Xerogel, and Aerogel.

7. The circuit of claim 1, wherein the monolithic inductor and the shield are operable at multi-GHz frequencies.

8. The circuit of claim 1, wherein the shield has a width of at least that of the monolithic inductor.

9. The circuit of claim 1, wherein the shield comprises a planar section and shielding regions extending vertically from edge regions of the planar section toward the monolithic inductor to further minimize fringe capacitance.

10. A differential circuit including the circuit as claimed in claim 1.

11. The differential circuit of claim 10, wherein the differential circuit comprises a circuit selected from the group consisting of a voltage controlled oscillator (VCO), a low noise amplifier (LNA), a differential amplifier, and an LC-tank circuit.

12. The differential circuit of claim 11, wherein the VCO comprises:
  first and second p-FET transistors each having a source, drain and gate, the sources being coupled to a voltage source, the gate of the first p-FET transistor being coupled to the drain of the second p-FET transistor, the gate of the second p-FET transistor being coupled to the drain of the first p-FET transistor;
  a differentially driven monolithic inductor having a shield differentially driven by phase shift buffers, the differentially driven monolithic inductor having first and second ends, the first end being coupled to the drain of the first p-FET transistor and the second end being coupled to the drain of the second p-FET transistor;
  at least one capacitor coupled in parallel with the differentially driven monolithic inductor; and
  first and second n-FET transistors each having a source, drain and gate, the first and second n-FET transistor sources being coupled to a ground source, the gate of the first n-FET transistor being coupled to the drain of the second n-FET transistor, the gate of second n-FET transistor being coupled to the drain of the first n-FET transistor.

13. The differential circuit of claim 11, wherein the LNA comprises:
  first and second inductors each having first and second ends, the first ends being coupled to a voltage source;
  first and second n-FET transistors each having a source, drain and gate, the gates being coupled to a voltage bias source, the drain of the first n-FET transistor being coupled to the second end of the first inductor, the drain of the second n-FET transistor being coupled to the second end of the second inductor;
  third and fourth n-FET transistors each having a source, drain and gate, the drain of the third n-FET transistor being coupled to the source the first n-FET transistor, the drain of the fourth n-FET transistor being coupled to the source of the second n-FET transistor, the source of the third n-FET transistor being coupled to a third inductor in series with a current source, the source of the fourth n-FET transistor being coupled to a fourth inductor in series with the current source;
  a first single-ended monolithic inductor having a first single-ended shield driven by a first phase shift buffer, the single-ended monolithic inductor having first and second ends, the first end being coupled to a positive signal of a differential signal, the second end being coupled to the gate of the third n-FET transistor; and
  a second single-ended monolithic inductor having a second single-ended shield driven by a second phase shift buffer, the single-ended monolithic inductor having first and second ends, the first end of the second single-ended monolithic inductor being coupled to a negative signal of the differential signal, the second end of the second single-ended monolithic inductor being coupled to the gate of the fourth n-FET transistor.

14. The differential circuit of claim 11, wherein the differential amplifier comprises:
  first and second n-FET transistors each having a source, drain and gate, the drains being coupled to a voltage source, the sources being coupled to a current source;
  a first single-ended monolithic inductor having a first single-ended shield driven by a first phase shift buffer, the single-ended monolithic inductor having first and second ends, the first end being coupled to a positive signal of a differential signal, the second end being coupled to the gate of the first n-FET transistor; and
  a second single-ended monolithic inductor having a second single-ended shield driven by a second phase shift buffer, the single-ended monolithic inductor having first and second ends, the first end of the single-ended monolithic inductor being coupled to a negative signal of the differential signal, the second end of the single-ended monolithic inductor being coupled to the gate of the second n-FET transistor.

15. A circuit comprising:
  a first monolithic inductor adapted to receive a positive signal of a differential signal;
  a second monolithic inductor adapted to receive a negative signal of the differential signal;
  a first buffer adapted to receive the positive differential signal and output a phase-shifted version of the positive differential signal;
  a second buffer adapted to receive the negative differential signal and output a phase-shifted version of the negative differential signal;
  a first shield positioned between the first monolithic inductor and a substrate, the first shield adapted to receive the phase-shifted output of the second buffer; and
  a second shield positioned between the second monolithic inductor and the substrate, the second shield adapted to receive the phase-shifted output of the first buffer.

16. The circuit of claim 15, wherein the first and second buffers comprise devices selected from the group consisting of common source and common emitter.

17. The circuit of claim 15, wherein the first and second buffers each comprise at least one Complimentary Metal Oxide Semiconductor (CMOS) inverter buffer.

18. A method of operating a differential circuit comprising:
  receiving a positive signal of a differential signal;
  receiving a negative signal of the differential signal;
  phase-shifting the positive differential signal by a first buffer;
  phase-shifting the negative differential signal by a second buffer;
  applying the positive and negative differential signals to at least one monolithic inductor; and
  applying the phase-shifted outputs of the first and second buffers to at least one shield underlying the at least one monolithic inductor.

19. The method of claim 18, wherein the positive differential signal is applied to a first end of the monolithic inductor, the negative differential signal is applied to a second end of the monolithic inductor, the phase-shifted output of the second buffer is applied to a first segment of the shield, the phase-shifted output of the first buffer is applied to a second segment of the shield.

20. The method of claim 18, wherein the positive differential signal is applied to the first monolithic inductor, the negative differential signal is applied to the second monolithic inductor, the phase-shifted output of the second buffer is applied to the first shield underlying the first monolithic inductor, the phase-shifted output of the first buffer is applied to the second shield underlying the second monolithic inductor.

* * * * *